(12) United States Patent
Kim et al.

(10) Patent No.: US 7,678,587 B2
(45) Date of Patent: Mar. 16, 2010

(54) CANTILEVER-TYPE PROBE AND METHOD OF FABRICATING THE SAME

(75) Inventors: Ki-Joon Kim, Seoul (KR); Yong-Hwi Jo, BuCheon (KR)

(73) Assignee: Phicom Corporation, Seoul (KR)

(*) Notice: Subject to any disclaimer, the term of this patent is extended or adjusted under 35 U.S.C. 154(b) by 51 days.

(21) Appl. No.: 11/990,275

(22) PCT Filed: Aug. 2, 2006

(86) PCT No.: PCT/KR2006/003045

§ 371 (c)(1),
(2), (4) Date: Feb. 11, 2008

(87) PCT Pub. No.: WO2007/018367

PCT Pub. Date: Feb. 15, 2007

(65) Prior Publication Data

US 2009/0128180 A1 May 21, 2009

(30) Foreign Application Priority Data

Aug. 10, 2005 (KR) .......................... 2005-0073319

(51) Int. Cl.
*G01R 31/26* (2006.01)
*G01R 31/28* (2006.01)

(52) U.S. Cl. .................... 438/14; 438/15; 438/694; 438/52; 216/2; 216/20; 29/593; 324/754; 324/762

(58) Field of Classification Search ............ 438/14–18; 324/754–765; 216/2, 20; 29/592–593
See application file for complete search history.

(56) References Cited

U.S. PATENT DOCUMENTS

| | | | |
|---|---|---|---|
| 6,358,426 B1 * | 3/2002 | Muramatsu et al. | 216/11 |
| 6,586,954 B2 | 7/2003 | Root | |
| 7,151,385 B2 * | 12/2006 | Hirata et al. | 324/754 |
| 7,459,399 B2 * | 12/2008 | Kim et al. | 438/694 |
| 7,523,539 B2 * | 4/2009 | Hayashizaki et al. | 29/595 |
| 2006/0073627 A1 * | 4/2006 | Park et al. | 438/52 |
| 2008/0048687 A1 * | 2/2008 | Jung | 324/754 |

FOREIGN PATENT DOCUMENTS

| | | |
|---|---|---|
| JP | 04-162339 | 6/1992 |
| JP | 200-227444 | 8/2000 |
| KR | 100358513 | 10/2002 |
| KR | 1020040105035 | 12/2004 |
| TW | 559666 | 11/2003 |
| TW | 567313 | 12/2003 |

* cited by examiner

*Primary Examiner*—Ha Tran T Nguyen
*Assistant Examiner*—Emily Y Chan
(74) *Attorney, Agent, or Firm*—Harness, Dickey & Pierce, P.L.C.

(57) ABSTRACT

Disclosed is a cantilever-type probe and methods of fabricating the same. The probe is comprised of a cantilever being longer lengthwise relative to the directions of width and height, and a tip extending from the bottom of the cantilever and formed at an end of the cantilever. A section of the tip parallel to the bottom of the cantilever is rectangular, having four sides slant to the lengthwise direction of the cantilever.

10 Claims, 8 Drawing Sheets

[Figure 1]

(CONVENTIONAL ART)

[Figure 2]

(CONVENTIONAL ART)

[Figure 3]

(CONVENTIONAL ART)

[Figure 4]

(CONVENTIONAL ART)

CANTILEVER-TYPE PROBE AND METHOD OF FABRICATING THE SAME

TECHNICAL FIELD

The present invention relates to probes of electronic device test systems and method of fabricating the same, which in particular relates to cantilever-type probes for testing electrical characteristics by contacting to pads of microscopic electronic devices and methods of fabricating the same.

BACKGROUND ART

Probes are mechanical tools for measuring electrical characteristics of microscopic electronic devices (e.g., semiconductor devices). As well known, a semiconductor device has pluralities of pads for communicate signals with an external electronic system. The semiconductor device may process electrical signals that are inputted through the pads, and then, the processed result is transferred to the external electronic system through the pads. The probes are arranged on a printed circuit board of a probe card, physically contacting with the pads, so that they form electrical paths for signal transmission with the external electronic system.

Probe cards, as well known, can be classified into needle, vertical, and cantilever types in accordance with kinds of probes. The probe cards are disclosed in Korean Patent Application No. 2001-0064603 or 2004-7021434. The needle-type probe card has a disadvantage such that probe needles may be distorted in horizontality and alignment due to repetitive use because the probe needles have insufficient restoring force. Additionally, since the probe needles of the needle-type probe card are large in size themselves, it is improper to be employed in testing a highly integrated semi-conductor device. The vertical probe card is otherwise appropriate for testing a highly integrated semiconductor device since it is smaller and probes are arranged in narrower intervals. But, the vertical probe card, as a force contacting a probe to a pad is directed toward a lengthwise direction of the probe, also has a problem of distortion due to an insufficient restoring force.

Figure 1:
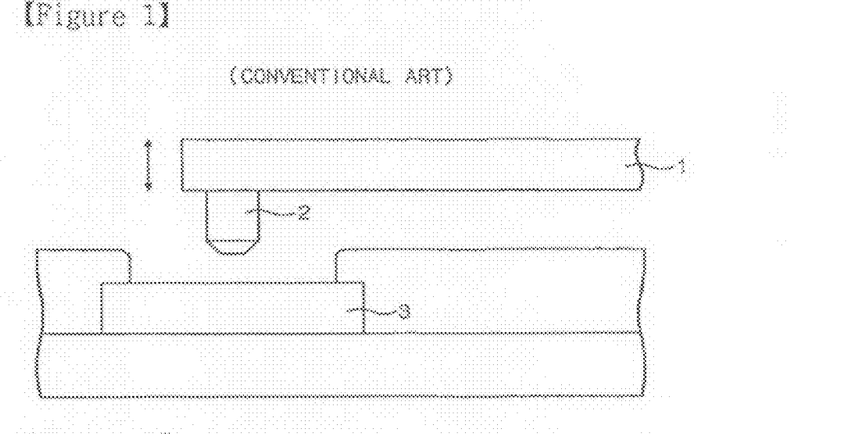
FIGS. 1 and 2 illustrate a conventional cantilever-type probe.

According to a typical cantilever-type probe card shown in FIG. 1, tips 2 contact with a pad 3 are bonded to an end of a cantilever 1, and the cantilever 1 is fixed to a printed circuit board (not shown) in parallel with a top surface of the pad 3. Accordingly, in this cantilever-type probe card, the force contacting probes (in detail, the tips 2) with the pad 3 acts in a direction perpendicular to a lengthwise direction of the cantilever 1. Such a structure of the cantilever-type probe card provides the sufficient restoring force thereto.

DISCLOSURE OF INVENTION

Technical Problem

Figure 2:
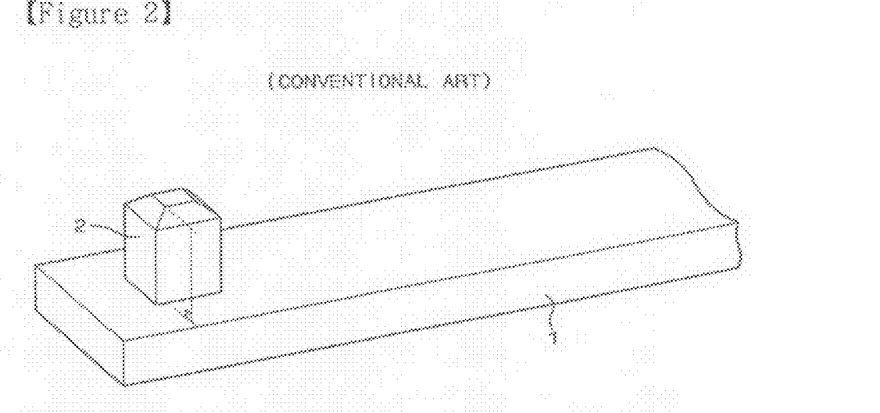
Figure 3:
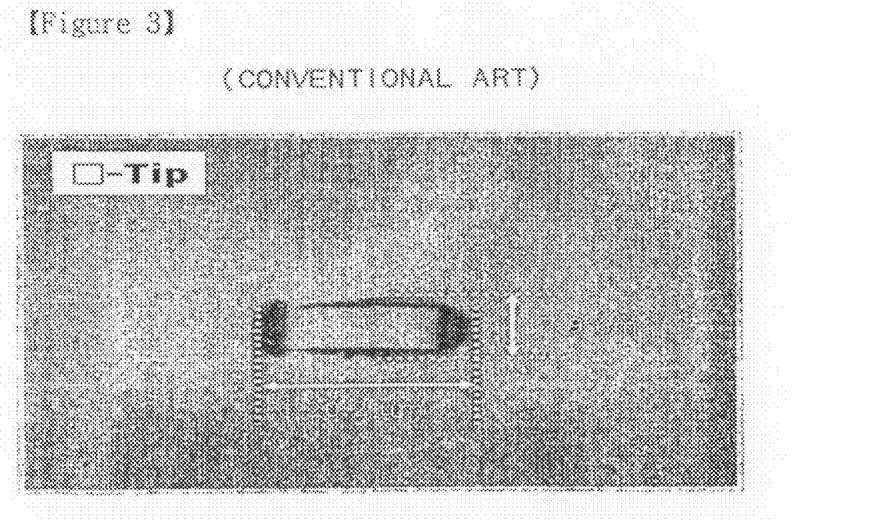
FIGS. 3 and 4 show a photograph and a simulation result about a scrub mark by a conventional cantilever-type probe.
Figure 4:
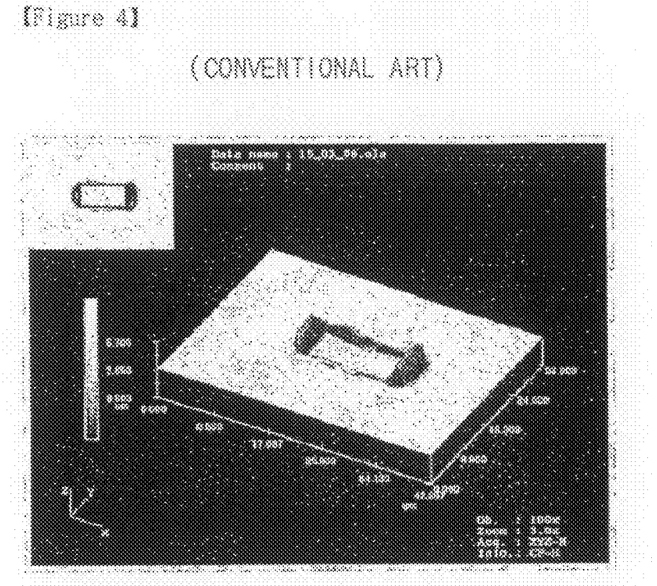

However, according to the conventional technology, as shown in FIG. 2, the end of the tip 2 contacting to the pad 3 is rectangular and two of four sides of the tip 2 are parallel with the lengthwise direction of the cantilever 1. The rest of the four sides of the tip 2 are perpendicular to the lengthwise direction of the cantilever 1. Thus, as shown in FIGS. 3 and 4, a long and deep scrub mark is generated by the conventional cantilever-type probe card. The long and deep scrub mark would make a conductive residual product 4 causing poor test results, a shorter lifetime of probe card, or damages on the micro electronic system.

Technical Solution

The present invention is directed to provide a cantilever-type probe capable of preventing a scrub mark from being formed deeper.

The present invention is also directed to a method of fabricating a cantilever-type probe capable of preventing a scrub mark from being formed deeper.

In some embodiments, the present invention provides a cantilever-type probe in which a diagonal between two confronting corners on a tetragonal tip is parallel with a lengthwise direction of a cantilever. This probe comprises a cantilever extending lengthwise rather than along width and height, and a tip formed at an end of the cantilever, extending from the bottom of the cantilever. A cross section of the tip, being parallel with the bottom surface of the cantilever, is a tetragon with four sidewalls slanting on a lengthwise direction of the cantilever.

An end portion of the tip becomes smaller in section as being distant from the cantilever. A diagonal of the tetragonal section parallel with the bottom surface of the cantilever is parallel with the lengthwise direction of the cantilever.

In another embodiment, the present invention provides a method of fabricating a cantilever-type probe in which a diagonal between two confronting corners on a tetragonal tip is parallel with a lengthwise direction of a cantilever. This method is comprised of forming a mask pattern, on a substrate, with a first opening to expose a top surface of a substrate, etching the substrate with using the mask pattern as an etch mask and forming a trench under the first opening, removing the mask pattern to expose a top surface of the substrate, forming a molding pattern, on the substrate including the trench, with a second opening to expose the trench, forming a conductive film to fill the second opening and the trench, etching the conductive film to be planarized until exposing the molding pattern and forming a probe with a tip and a cantilever in the trench and the second opening, respectively, and removing the molding pattern and the substrate to lift off the probe. The first opening is a hexahedral space formed at an end of the second opening. Sidewalls of the first opening slant on a lengthwise direction of the second opening.

According to embodiments of the invention, the sidewalls of the first opening are slanting with 40° through 50° on the lengthwise direction of the second opening.

The substrate is formed of a material having etching selectivity to the mask pattern, the molding pattern, and the conductive film. The substrate is preferred to be formed of a material with a crystalline structure. For instance, the substrate is formed of single crystalline silicon. The mask pattern is formed of at least one selected from silicon oxide, silicon nitride, silicon oxynitride, and photoresist. The molding pattern is formed of at least one selected from silicon oxide, silicon nitride, silicon oxynitride, and photoresist. Preferably, the substrate has a crystalline orientation with <100> in out-of-plane direction.

Forming the trenches is carried out with including a step of etching the trench by means of an etchant selected from potassium hydroxide (KOH), tetramethyl ammonium hydroxide, and ethylene diamine phyrochatecol (EDP). In this case, a lower portion of the trench may become narrower in width as being close to the bottom of the trench from an entrance of the trench.

Advantageous Effects

According to the invention, as the diagonal between two confronting corners of a tetragonal tip is parallel with the lengthwise direction of a cantilever, a scrub mark is generated by the corner of the tip while a probe is being over-driven for test. Since a scrubbing operation by the corner of the tip acts to reduce a length and depth of the scrub mark, the probe according to the present invention offers improvement against the problems of bad test results, reduction of probe card lifetime, and damages on measure target. Moreover, the probe according to the invention is able to easily break through a natural oxide film formed on a pad of a measure target. And, since there is smaller scrubbing residual product, it makes a cleaning period of the probe be longer.

BRIEF DESCRIPTION OF THE DRAWINGS

FIGS. 7 through 19 are sectional views showing processing steps for fabricating the cantilever-type probe in accordance with the present invention, taken along with the dotted line II-II' of FIG. 5.

BEST MODE FOR CARRYING OUT THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

It will be understood that when a layer is referred to as being "on" another layer or substrate, it can be directly on the other layer or substrate, or intervening layers may also be present Also, in the drawings, the thicknesses of layers and regions are exaggerated for clarity. It will also be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed could be termed a second element, component, region, layer or section without departing from the teachings of the present invention. Each embodiment described and illustrated herein includes its complementary embodiment as well.

Figure 5:
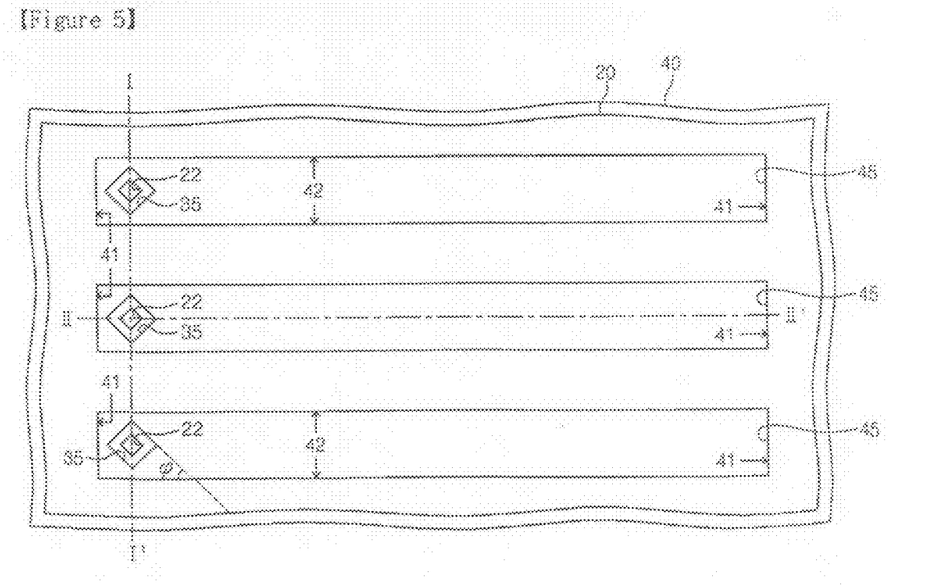
FIG. 5 is a plane view illustrating a cantilever-type probe in accordance with the present invention.

FIG. 5 is a plane view illustrating a cantilever-type probe in accordance with the present invention. And, FIGS. 6 through 18 and 7 through 19 are sectional views showing processing steps for fabricating the cantilever-type probe in accordance with the present invention, taken along respectively with the dotted lines I-I' and II-II' of FIG. 5.

Figure 6:
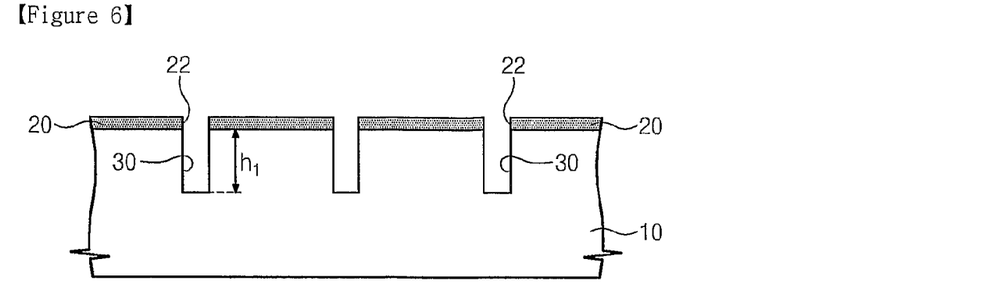
FIGS. 6 through 18 are sectional views showing processing steps for fabricating the cantilever-type probe in accordance with the present invention, taken along with the dotted line I-I' of FIG. 5.
Figure 7:
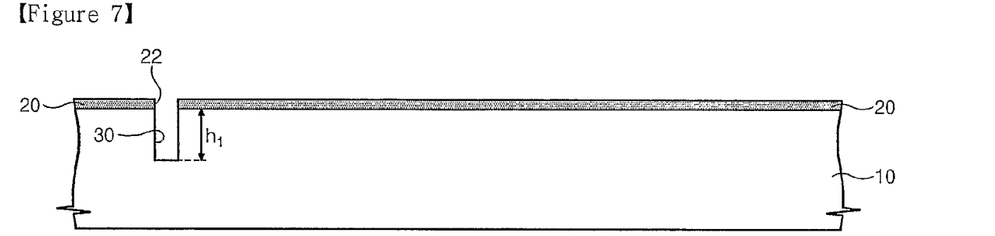

Referring to FIGS. 5, 6 and 7, a mask pattern 20 is formed on a substrate 10. In order to permit an anisotropic etching in the subsequent wet etch process, the substrate 10 is preferred to be made of a crystalline material. According to embodiments of the present invention, the substrate 10 is formed of a single-crystalline silicon having the crystalline orientation with <100> in out-of-plane direction.

Forming the mask pattern 20 is carried out with including a step of, after depositing a mask film on the substrate 10, patterning the mask film to form first openings 22 that expose predetermined top surfaces of the substrate 10. Here, the mask pattern 20 is formed of a material having etching selectivity to the substrate 10. For instance, the mask pattern 20 may be made of at least one selected from silicon oxide, silicon nitride, silicon oxynitride, and photoresist. According to embodiments of the present invention, the mask pattern 20 is made of silicon oxide. Forming the mask pattern 20 with silicon oxide may be accomplished by thermally oxidizing the substrate 10 or chemical vapor deposition (CVD). The first openings 22 may be configured in rectangular types with four sidewalls, which is preferred to be shaped in a regular square.

Continuously, using the mask pattern 20 as an etch mask, the substrate 10 is anisotropically etched to a predetermined depth $h_1$, resulting in first preliminary trenches 30 to be used as molds for making tips of probes. The anisotropic etching process to the substrate 10 may be carried out with using processing gas selected from $CF_4$, $SF_6$, $C_4F_8$, and $O_2$. According to embodiments of the present invention, this step utilizes $SF_6$, $C_4F_8$, or $O_2$ as the processing gas.

Figure 8:
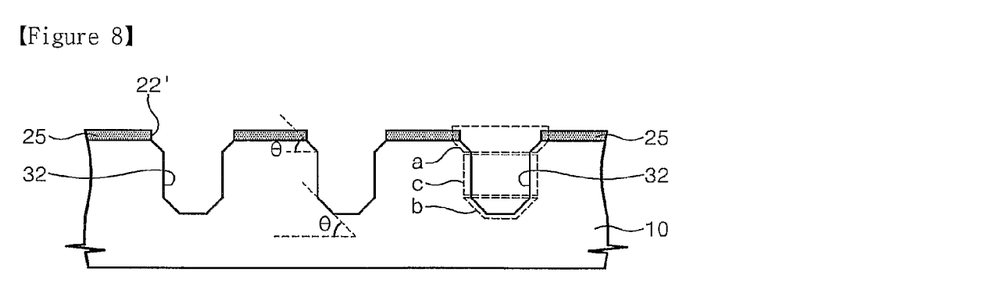
Figure 9:
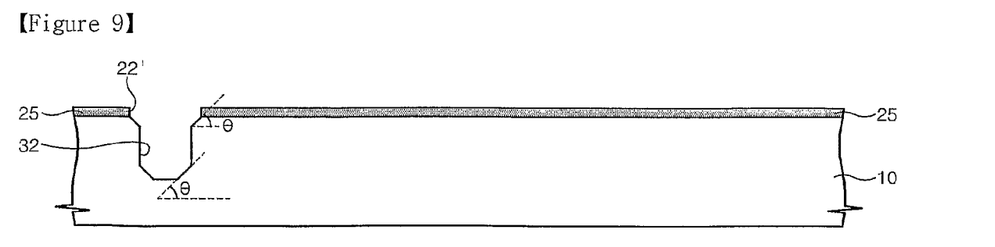

Referring to FIGS. 5, 8, and 9, the mask pattern 20 is patterned to extend widths of the first openings 22, forming first enlarged openings 22' to expose top surfaces of the substrate 10 around the first preliminary trenches 30. Patterning the mask pattern 20 is accomplished with including a step of, after forming a photoresist pattern (not shown) by means of a photolithography process, etching the mask pattern 20 with using the photoresist pattern as an etch mask.

Figure 10:
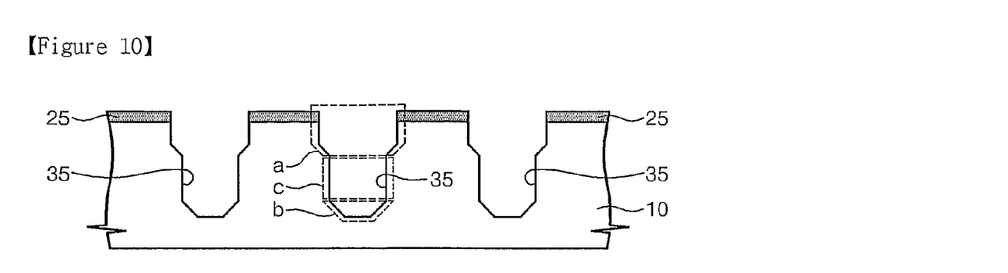
Figure 11:
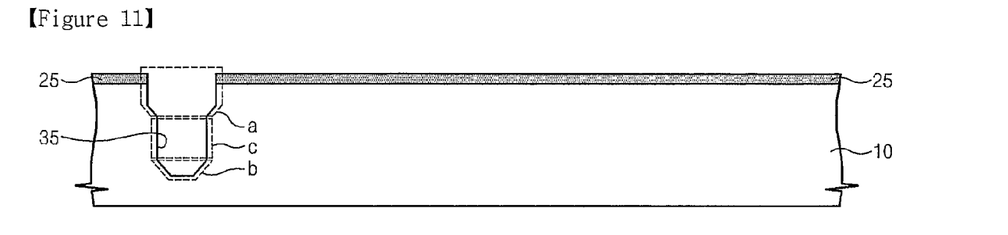

After then, a wet etching process to the substrate 10 partially exposed by the first enlarged openings 22' is carried out to extend the first preliminary trenches 30. As a result, second preliminary trenches 32 are formed under the first enlarged openings 22', previously defining the shapes of probe tips. According to embodiments of the present invention, forming the second preliminary trenches 32 is carried out with using an etchant selected from potassium hydroxide (KOH), tetrametyl ammonium hydroxide, and ethylene diamine phyrochatecol (EDP). In a case that the substrate 10 is formed of single crystalline silicon, an etching rate is different in accordance with a crystalline orientation of the substrate 10. Therefore, as illustrated in the figures, the sidewall of the second preliminary trench 32 may be vertical or slant with an angle to the top surface of the substrate 10 (here, the angle is 54.74°). The details about the difference of etching rates according to crystalline orientation on the surface are disclosed in pp. 187-189 of "Fundamentals of Microfabrication: The Science of Miniaturization" (the second edition, CRC PRESS) written by Marc J. Madou. With such relations between crystalline orientations and etching rates, at the entrance and bottom, a and b, of the second preliminary trench 32, the width of the second preliminary trench 32 becomes narrower as being close toward the bottom of the second trench from the entrance of the second trench. In the intermediate region c between the entrance and bottom a and b, there is formed a sidewall with a predetermined width. Referring to FIGS. 5, 10, and 11, using the mask pattern 25 as an etch mask, the substrate 10 exposed by the first enlarged openings 22' is anisotropically etched to form trenches 35 deeper than the second preliminary trenches 32. Forming the trenches 35 may be carried out with using processing gas selected from $CF_4$, $SF_6$, $C_4F_8$, and $O_2$. According to embodiments of the present invention, this step utilizes $SF_6$, $C_4F_8$, or $O_2$ as the processing gas.

By the anisotropic etching operation, the bottom profile of the second preliminary trench 32 is transcribed into the trench 35. The profiles of the bottom and intermediate region, b and c, of the trench 35 match with their correspondents of the second preliminary trench 32. And, a depth at the entrance of the trench 35 is larger than that at the entrance a of the second preliminary trench 32. The trenches 35 become molds for defining the configurations of probe tips according to the present invention.

Meanwhile, according to the aforementioned embodiment, after conducting the anisotropic etching process to form the first preliminary trenches 30 and conducting the isotropic etching process to form the second preliminary trenches 32, the anisotropic etching process is resumed to form the trenches 35. But, it is permissible to alter the procedure of forming the trenches 35. For instance, the sequence of the processing steps may be changed, e.g., partially skipping a step of the procedure or adding a step to the procedure. Understanding the aforementioned relations between crystalline orientations and etching rates is useful for implementing modifications of the embodiments by those skilled in this art. Therefore, it is apparent that the invention is not restrictive to the aforementioned features.

Figure 12:
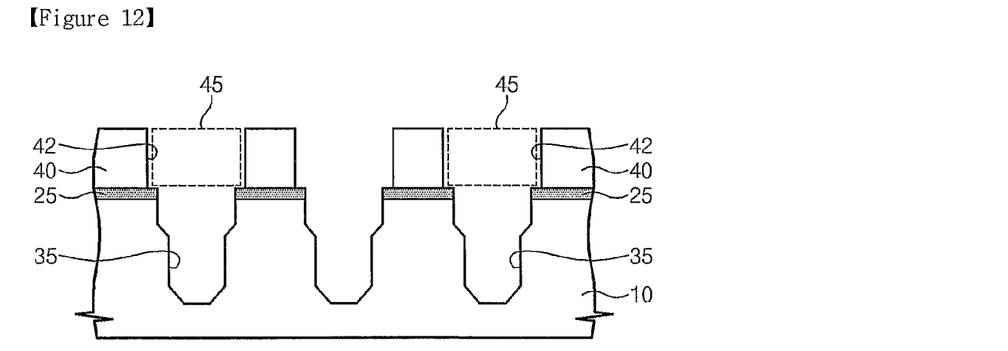
Figure 13:
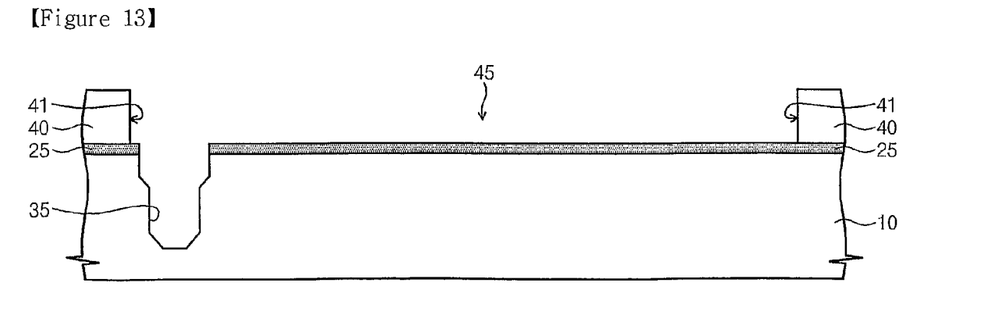

Referring to FIGS. 5, 12, and 13, a molding pattern 40 is formed on the mask pattern 25 to define cantilevers of the probes, including second openings 45. Forming the molding pattern 40 is carried out with including a step of, after depositing a molding film on the mask pattern 25, patterning the molding film to form the second openings that expose the trenches 35. The molding pattern 40 is formed of a material having etching selectivity to the substrate 10. For example, the molding pattern 40 may be made of at least one selected from silicon oxide, silicon nitride, and photoresist. According to embodiments of the present invention, the molding pattern 40 is formed of a photoresist film made by a photolithography process.

The second openings 45, as illustrated in FIG. 5, are defined by narrower width-wise sidewalls 42 and length-wise sidewalls 41 having wider widths than the sidewalls 42. As a result, according to this embodiment, the second openings 45 have rectangular cross sections. But, the shape of the second opening 45 may be modifiable by options from necessities of those skilled in this art.

According to the present invention, the sidewalls of the first opening 22 slant on the length-wise sidewalls of the second openings 45. A slanting angle between the sidewalls,

φ, is preferred to be 40° through 50°. It is more preferred for the angle

φ to be 45°. For this, as shown in FIG. 5, the second opening 45 is formed lengthwise in parallel with a diagonal between the confronting corners of the first opening 22.

Such an arrangement relation between the first and second openings 22 and 45 is simply applied hereto even though the shape of the second opening 45 may vary. If the second opening 45 varies in shape, the lengthwise direction of the second opening 45 may be defined in connection with a distortional direction of the cantilever to be formed by the subsequent processing step, or with a direction of the scrub mark. For instance, when the probe contacts with a pad, the distortional direction of the cantilever decides the direction of the scrub mark. And, the direction of the scrub mark is defined along the lengthwise direction regardless of the configuration of the second opening 45. The lengthwise direction of the second opening 45, which is defined as aforementioned, is parallel with the diagonal of the first opening 22.

According to an embodiment of the present invention, the first enlarged openings 22' may be also formed to have tetragonal sections. And, as illustrated in FIG. 5, a diagonal between confronting corners of the first enlarged opening 22' is parallel with the lengthwise direction of the second opening 45. But, according to another embodiment of the invention, the first enlarged openings 22' may be formed with their own direction regardless of the lengthwise direction of the second openings 45.

According to a modified embodiment of the invention, it is permissible to remove the mask pattern 25 prior to forming the molding pattern 40. In this case, it offers an advantage that there is no need of conducting an additional etching step for removing the mask pattern 25 at the subsequent step of lifting-off probes.

Figure 14:
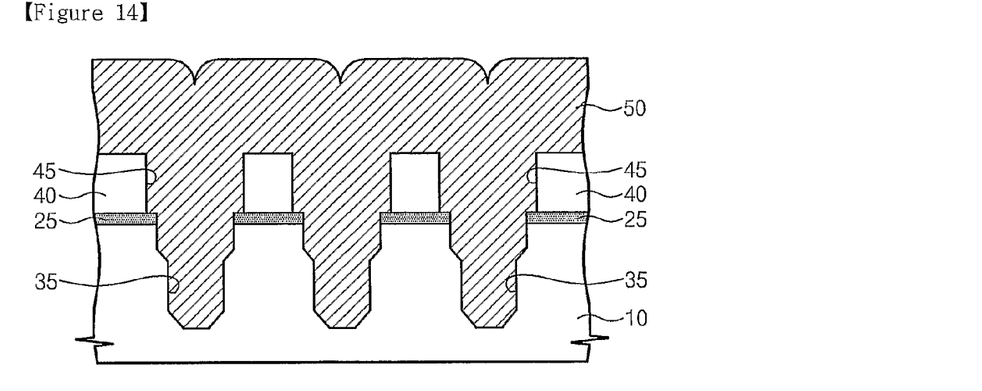
Figure 15:
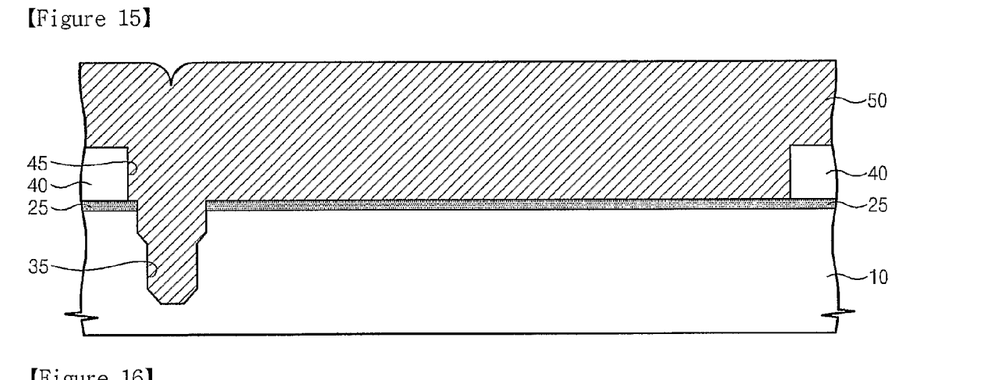
Figure 16:
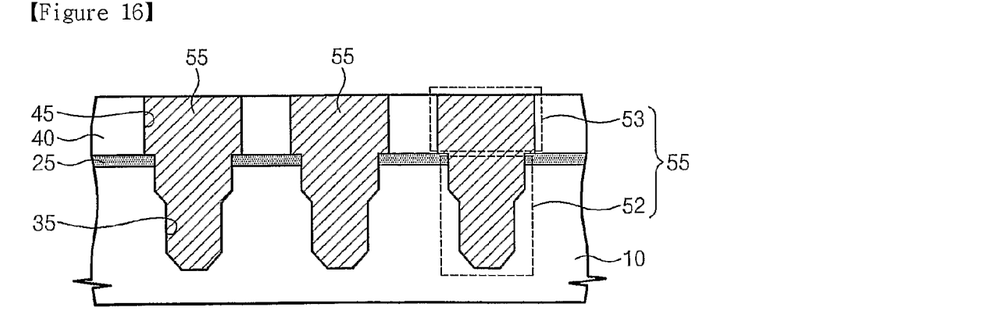
Figure 17:
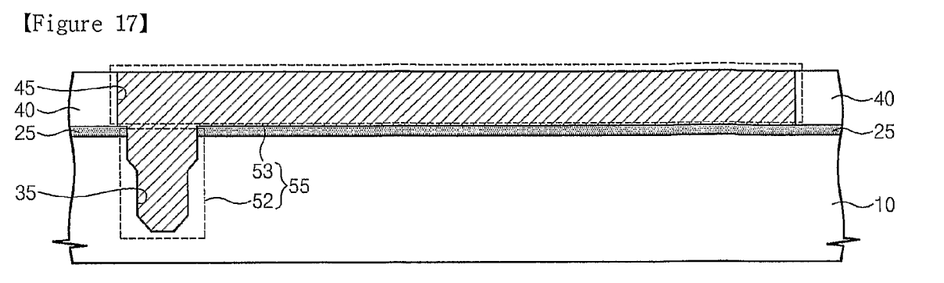

Referring to FIGS. 5, 14, and 15, on the molding pattern 40, a conductive film 50 is formed to fill the trenches 35 and the second openings 45. The conductive film 50 is formed by means of electrical plating, chemical vapor deposition, or sputtering. The conductive film 50 is formed of a metallic material having etching selectivity to the substrate 10. For instance, the conductive film 50 is preferred to be made of one selected from copper, nickel, and an alloy of them. The conductive film 50 is formed in a thickness capable of completely filling up the trenches 35 and the second openings 45.

Referring to FIGS. 5, 14, and 15, the conductive film 50 is etched to be planarized until exposing the top surfaces of the molding pattern 40, resulting in tips 52 and the cantilevers 53 filling the trenches 35 and the second openings 45, respectively. The tip 52 and the cantilever 53 constitute a probe 55 according to the invention. As the probe 55 results from etching the conductive film 50, the tip 52 and the cantilever 53 are constructed in one body. Forming the probes 55 is carried out with including a step of etching the conductive film 50 by means of a chemical-mechanical polishing technique.

Figure 18:
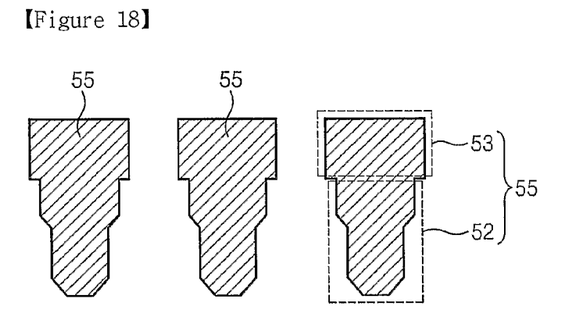
Figure 19:
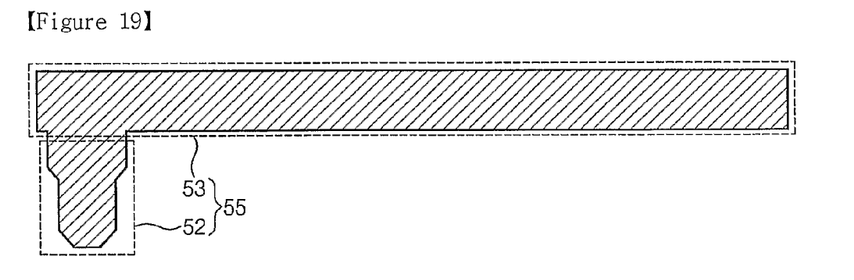

Referring to FIGS. 5, 18 and 19, the molding pattern 40, the mask pattern 25, and the substrate 10 are removed to lift off the probes 55 from the substrate 10. The processing step of lifting off the probes 55 is carried out with an etching recipe having etching selectivity to the probes 55.

The tips 52 are formed with using the trenches 35 as molds, while the cantilevers 53 are formed with using the second openings 45 as molds. Thus, the structures of the tips 52 and the cantilevers 53 are determined by the configurations and dispositions of the trenches 35 and the second openings 45.

Figure 20:
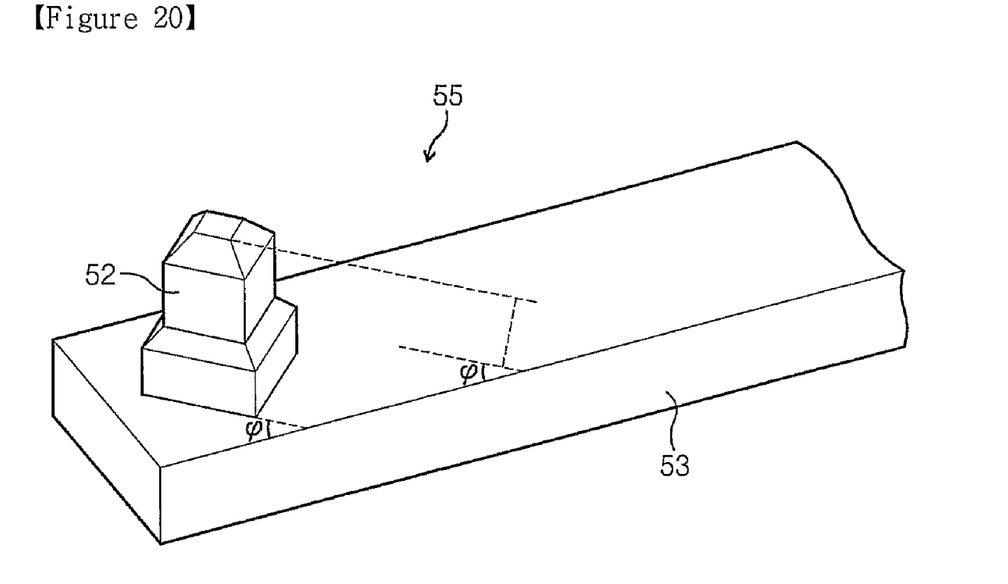
FIGS. 20 and 21 are perspective views illustrating the cantilever-type probe in accordance with the present invention.
Figure 21:
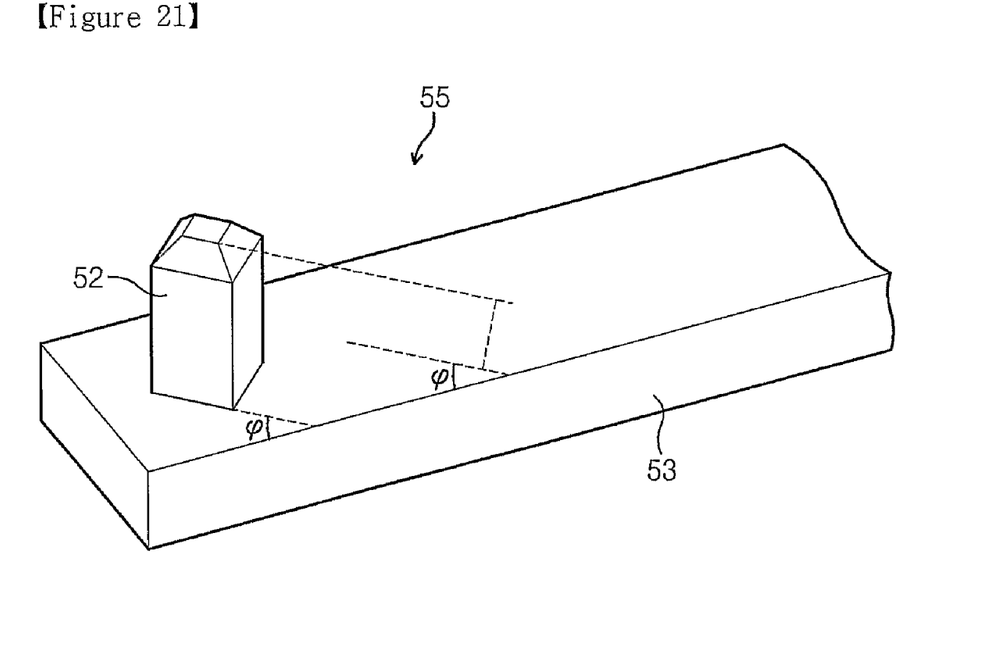

Namely, as illustrated in FIGS. 20 and 21, the cantilever 53 extends along its lengthwise direction, longer than its widthwise and height-wise directions. The tip 52 is disposed at an end of the cantilever 53, extending from the bottom of the cantilever 53 (FIGS. 20 and 21 depict such that the bottom of the cantilever 53 looks upward in convenience of illustration). The cross section of the tip 52 parallel with the bottom surface of the cantilever 53 is configured in a tetragonal shape. And, four sides of the tip 52 slant with the angle

φ on the lengthwise direction of the cantilever 53.

As aforementioned, according to a preferred embodiment of the present invention, the slanting angle

φ is ranged in 40° through 50°. It is more preferred for the slope angle

φ to be 45°. In other words, according to this embodiment, the diagonals on the tetragonal sections of the tips 52 are parallel with the lengthwise direction of the cantilevers 52.

Further, as aforementioned with reference to FIGS. 10 and 11, the end portion of the tip 52 becomes smaller in section as being distant from the bottom of the cantilever 53.

Figure 22:
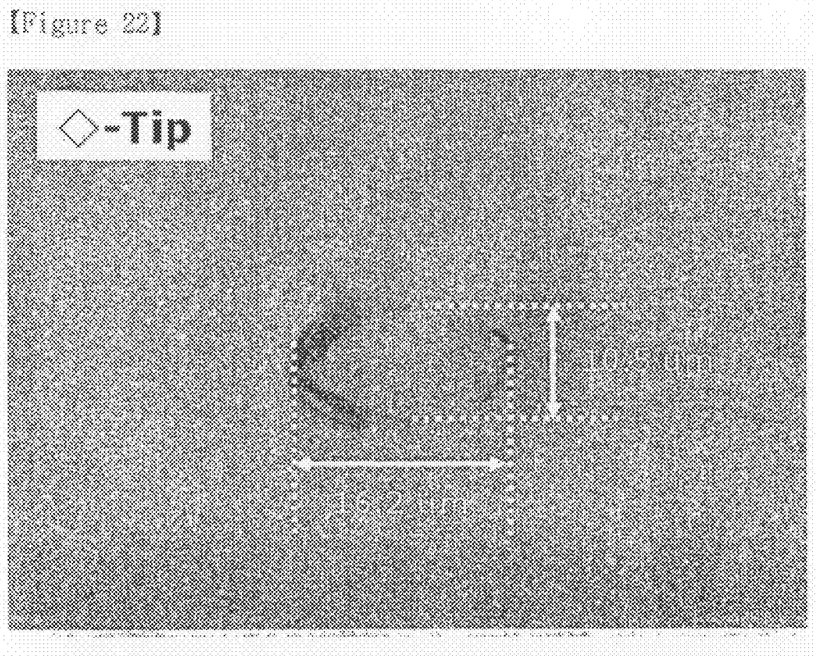
FIGS. 22 and 23 show a photograph and a simulation result about a scrub mark by the cantilever-type probe according to the present invention.
Figure 23:
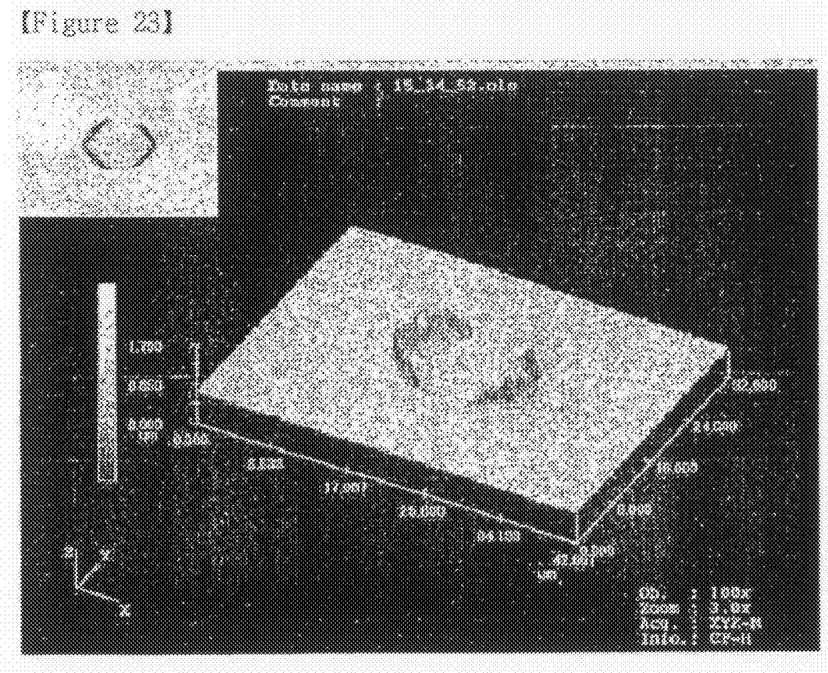

FIGS. 22 and 23 show a photograph and a simulation result about a scrub mark by the cantilever-type probe according to the invention. In detail, FIG. 22 is a microscopic photograph showing a scrub mark generated by an over-drive contacting operation of 100□. The scrub mark formed by the strobe according to the invention is configured in a hexagonal shape with a length of 16.2□ and a width of 10.5□. But, referring to FIG. 3, in the same over-drive condition, that by the conventional probe is configured in a rectangular shape with a length of 20.2□ and a width of 7.9□. Additionally, while the probe according to the present invention makes a scrub mark with a depth of 1700 Å, the conventional probe makes a scrub mark with a depth of 6300 Å.

As a result, the scrub mark made by the probe according to the present invention is smaller than that of the conventional probe both in length and depth. The probes according to the present invention leave scrubbing residual product less than that by the conventional strobes. Considering that as aforementioned with relevant to the conventional art, the scrubbing refuse causes bad test results, reduction of probe card lifetime, and damages on measure target, it can be understood the probes according to the invention offers improved effects better than the conventional technology.

These improvements arise from a difference of contacting schemes between the tip and the pad in the over-drive operation. Namely, according to the present invention, since the diagonal of the tetragonal tip is parallel with the lengthwise direction of the cantilever, the scrub mark is made by the corner of the tip. The hexagonal scrub mark in FIG. 22 shows such a result. In the conventional technology, the scrub mark is made by one side of the tip because the sidewalls of the tetragonal tip are vertical to or parallel with the lengthwise direction of the cantilever. In summary, the present invention is different from the conventional art in the technical fact that the tip's portion making the scrub mark is the corner in the present invention while the sidewall in the conventional art, which results in the improvements aforementioned.

In addition, regarding that pressure applied to a face is inversely proportional to an area contacting thereto, the scrubbing operation with the corner of the tip, as like the probe according to the present invention, is carried out with easiness in breaking through a natural oxide film formed on the pad.

INDUSTRIAL APPLICABILITY

The invention is applicable to testing microscopic electronic devices having pads.

The invention claimed is:

1. A method of fabricating a probe, comprising:
    forming a mask pattern with a first opening on a substrate, the first opening exposing a predetermined region of top surface of the substrate;
    etching the substrate using the mask pattern as an etch mask to form a trench under the first opening;
    removing the mask pattern to expose a top surface of the substrate;
    forming a molding pattern with a second opening on the substrate including the trench, the second opening exposing the trench;
    forming a probe with a tip and a cantilever, the tip and the cantilever being disposed in the trench and the second opening, respectively; and
    removing the molding pattern and the substrate to lift off the probe,
    wherein the first opening is a hexahedral space formed at an end of the second opening, and sidewalls of the first opening slant on a lengthwise direction of the second opening.

2. The method according to claim 1, wherein the sidewalls of the first opening are tilted to the lengthwise direction of the second opening by from 40 to 50 degree.

3. The method according to claim 1, wherein the substrate is formed of a material having etching selectivity to the mask pattern, the molding pattern, and the conductive film,
    wherein the substrate is formed of a material with a crystalline structure.

4. The method according to claim 1, wherein the substrate is formed of single crystalline silicon,
    wherein the substrate has a crystalline orientation with <100> in out-of-plane direction.

5. The method according to claim 1, wherein the mask pattern is formed of at least one selected from silicon oxide, silicon nitride, silicon oxynitride, and photoresist,
    wherein the molding pattern is formed of at least one selected from silicon oxide, silicon nitride, silicon oxynitride, and photoresist.

6. The method according to claim 1, wherein the forming of the trenches comprises etching the trench using one etchant selected from the group consisting of potassium hydroxide (KOM, tetrametyl ammonium hydroxide, and ethylene diamine phyrochatecol (EDP),
    wherein a lower portion of the trench becomes narrower in width as being close to the bottom of the trench from an entrance of the trench.

7. The method according to claim 1, wherein the forming of the conductive film is performed by using at least one selected from electroplating, chemical vapor deposition, and sputtering.

8. The method according to claim 1, wherein the forming of the probe comprises:
    forming a conductive film to fill the second opening and the trench; and planarizingly etching the conductive film to expose the molding pattern.

9. The method according to claim 3, wherein the substrate is formed of single crystalline silicon, wherein the substrate has a crystalline orientation with <100> in out-of-plane direction.

10. The method according to claim 3, wherein the mask pattern is formed of at least one selected from silicon oxide, silicon nitride, silicon oxynitride, and photoresist,
    wherein the molding pattern is formed of at least one selected from silicon oxide, silicon nitride, silicon oxynitride, and photoresist.

* * * * *